United States Patent

Ormerod et al.

[19]

[11] Patent Number: 6,118,207
[45] Date of Patent: Sep. 12, 2000

[54] PIEZO-ELECTRIC ACTUATOR OPERABLE IN AN ELECTROLYTIC FLUID

[75] Inventors: William Ormerod, Hooksett; Robert R. Tipton, Goffstown, both of N.H.

[73] Assignee: DEKA Products Limited Partnership, Manchester, N.H.

[21] Appl. No.: 09/188,942

[22] Filed: Nov. 10, 1998

Related U.S. Application Data

[60] Provisional application No. 60/065,369, Nov. 12, 1997.

[51] Int. Cl.[7] .................................................. H01L 41/04
[52] U.S. Cl. .................................... 310/328; 310/340
[58] Field of Search ..................................... 310/340, 330, 310/331, 332, 328

[56] References Cited

U.S. PATENT DOCUMENTS

| | | | |
|---|---|---|---|
| 4,553,059 | 11/1985 | Abe et al. ................................ | 310/328 |
| 4,565,942 | 1/1986 | Sakai et al. .............................. | 310/338 |
| 4,933,919 | 6/1990 | Geil et al. ................................ | 367/159 |
| 4,939,405 | 7/1990 | Okuyama et al. ....................... | 310/330 |

FOREIGN PATENT DOCUMENTS

| | | |
|---|---|---|
| 0 322 899 A2 | 7/1989 | European Pat. Off. . |
| 95/07820 | 3/1995 | WIPO . |

OTHER PUBLICATIONS

Graf, Rudolf. Radio Shack Dictionary of Electronics, 4th Ed. Indiana, Howard W. Sams & Co., Inc., 1972, p. 211.
Japanese Patent Abstract 61046082, Mar. 6, 1984, Nippon Telegr & Teleph Corp.

*Primary Examiner*—Nestor Ramirez
*Assistant Examiner*—Peter Medley
*Attorney, Agent, or Firm*—Bromberg & Sunstein LLP

[57] ABSTRACT

A piezo-electric actuator operable in a fluid. The actuator has a piezo-electric element having one or more layers of piezo-electric material and electrodes adjacent to the piezo-electric material, the electrodes being coupled to electrical leads. A conductive layer surrounds the piezo-electric element, serving as a Faraday cage for shielding the fluid from effects due to electric fields within the conductive layer. A seal substantially impermeable to the fluid surrounds the piezo-electric element.

12 Claims, 3 Drawing Sheets

PIEZO-ELECTRIC ACTUATOR OPERABLE IN AN ELECTROLYTIC FLUID

The present application claims priority from U.S. provisional application 60/065,369, filed Nov. 12, 1997, which is incorporated herein by reference.

TECHNICAL FIELD

The present invention relates to piezo-electric actuators, and more particularly, to piezo-electric benders that are operable in electrolytic fluids such as water.

BACKGROUND ART

A common application of piezo-electric actuators is for controlling fluid flow through a valve. Piezo-electric actuators such as benders are typically made from layers of piezoceramic material (such as lead zirconate titanate, for example) stacked between conducting electrodes, typically metal, across which electric potentials are applied for creating electric fields across the piezoceramic layers.

Piezo-electric benders, when used to control fluid flow, are typically isolated from the fluid to prevent corrosion and chemical attack by the fluid on the metal and piezoceramic layers. One failure mode of piezo-electric benders immersed in water is the growth of metallic dendrites through the ceramic layers with subsequent shorting together of the conducting layers. Even if the bender is coated, water may interact corrosively with the coating and cause its breakdown.

Accordingly, it is desirable to develop a configuration permitting a piezo-electric actuator to work immersed in water or other electrolytic fluid.

SUMMARY OF THE INVENTION

The present invention, in one embodiment, is directed to a piezo-electric actuator operable in a fluid. The piezo-electric actuator has first and second electrical leads, a conductive layer surrounding the piezo-electric element, and a seal substantially impermeable to the fluid surrounding the piezo-electric element. In alternate embodiments of the invention, the conductive layer may be electrically grounded, and the conductive layer may be coupled to one of the first and second electrical leads. In further alternate embodiments, the conductive layer and the substantially impermeable seal may be provided by a single material, and the conductive layer may be enclosed by the substantially impermeable seal.

In accordance with a further embodiment of the present invention, there is provided a piezo-electric actuator operable in a fluid wherein the actuator includes a piezo-electric element having exterior and interior electrodes with the exterior electrodes being electrically grounded. The piezo-electric actuator also has a seal surrounding the piezo-electric element, the seal being substantially impermeable to the fluid. The exterior electrodes may be electrically grounded.

In accordance with another aspect of the present invention, there is provided a method for activating a piezo-electric actuator having first and second electrodes. The method includes the steps of providing an electrically conductive coating at the exterior of the piezoelectric actuator; sealing the electrically conductive coating from the fluid by means of a seal substantially impermeable to the fluid, and applying an electrical potential across the first and second electrodes.

DETAILED DESCRIPTION OF SPECIFIC EMBODIMENTS

Figure 1A:
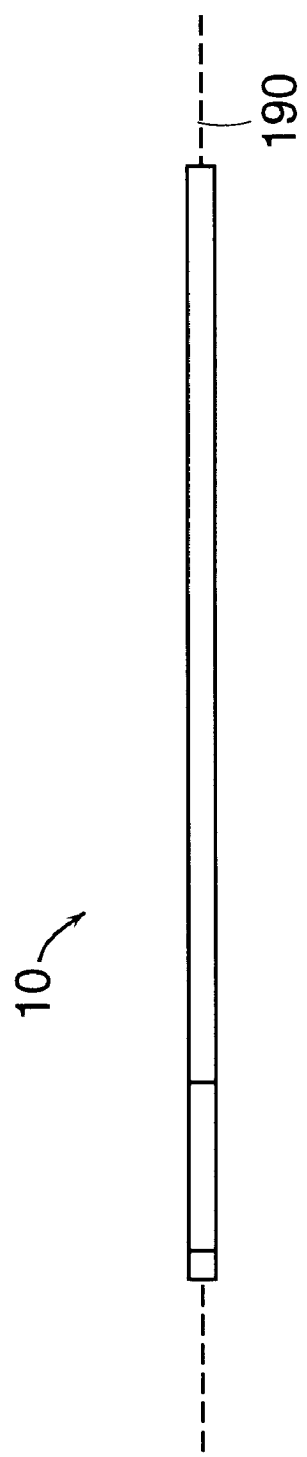
FIG. 1A is a side view of a non-activated piezo-electric bender in accordance with one embodiment of the present invention.
Figure 1B:
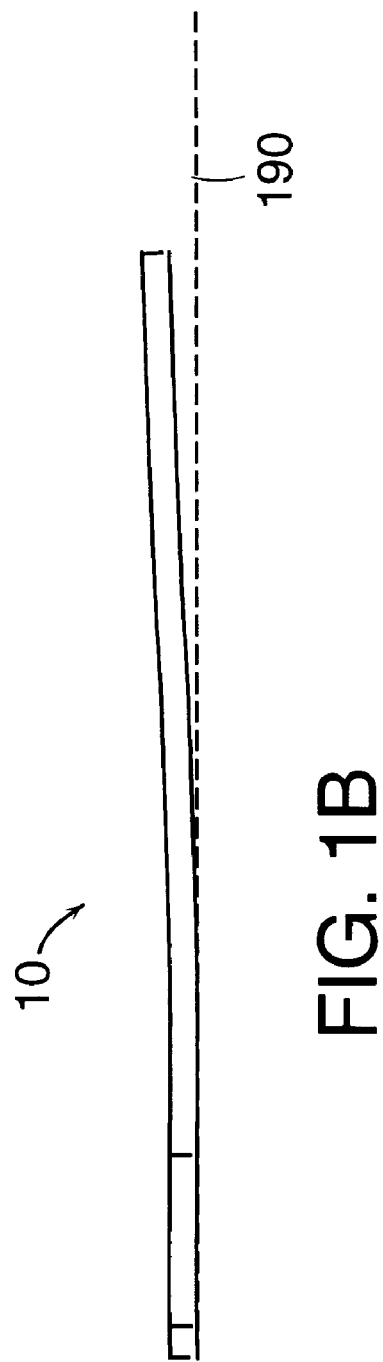
FIG. 1B is a side view of the piezo-electric bender shown in FIG. 1A as activated.
Figure 2:
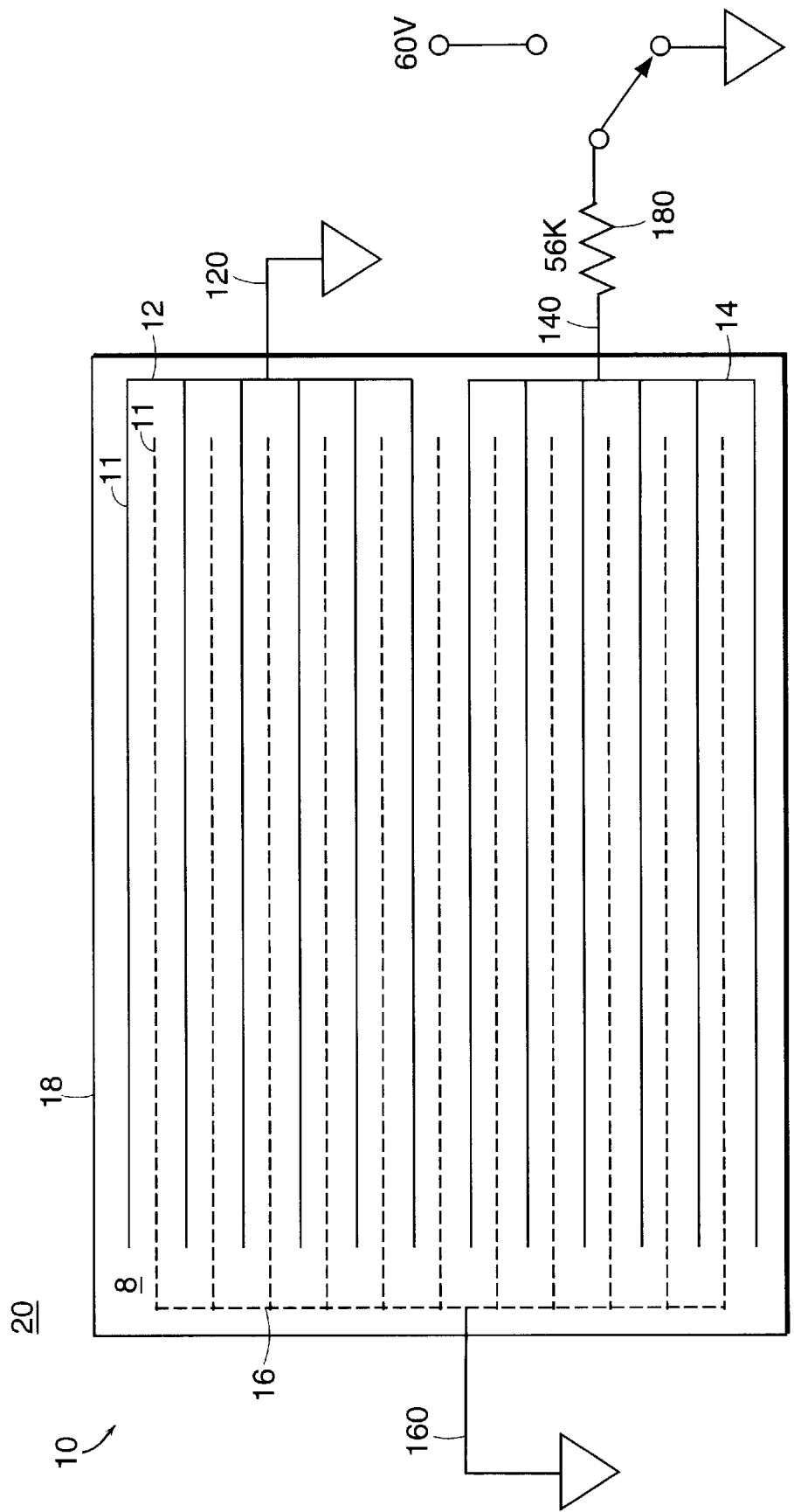
FIG. 2 is a schematic representing a cross section of the piezo-electric bender of FIG. 1A, showing the connection of electrodes to external contacts.

FIGS. 1A–B illustrate a piezo-electric bender 10 in accordance with one embodiment of the present invention. The bender 10, as shown in FIG. 1A, is relaxed and inactivated, while FIG. 1B shows bender 10 in its activated, or bent, state. Bending is achieved by application of an electric field across layers of piezoceramic material, as discussed now with reference to FIG. 2. As shown in FIG. 2, the piezoceramic bender 10 comprises a piezoceramic material 8 interleaved by a plurality of electrode layers 11 aligned in an alternating pattern. The electrode layers 11 are made of a conducting material, typically metal, the application of which to piezoceramic material 8 is well known in the art. In one arrangement of electrode layers 11, shown here by way of example only, an upper group 12 of electrodes is electrically interconnected, as is a lower group 14 of electrodes, as is also a third and inner group 16 of electrodes. The electrodes are interleaved such that one electrode from inner group 16 is disposed between any two adjacent electrodes of both upper group 12 and lower group 14. An example of a piezo-electric bender having the electrode configuration shown is Phillips bender, model number P/N 9922 531 50026, manufactured by Phillips Components in Roermond, the Netherlands. The aforesaid Phillips bender has twenty two (22) active piezo-electrode layers. Conductive contact 120 is electrically coupled to all of the upper group 12 of electrodes while conductive contact 140 is electrically coupled to all of the lower group 14 of electrodes. Similarly, conductive contact 160 is electrically coupled to all of the inner group 16 of electrodes. Conductive contacts 120, 140, and 160 provide for connection of the respective electrodes to external circuitry.

In accordance with another embodiment of the invention, two piezo-electric layers may be configured as a bi-layer, with electrodes disposed between the two piezo-electric layers and exterior to each of the layers. Accordingly, the term "multi-layer", as used in this description and in any appended claims, will encompass any number greater than one of layers of piezo-electric material. Use of a single layer of piezo-electric material for an actuator operable in a fluid is similarly within the scope of the present invention.

In one known mode of operation of bender 10, contacts 120 and 160 are connected to ground, and contact 140 may be switched either to a 60V potential or to ground, in either case via a current-limiting series resistor 180. When contact 140 is connected to ground, the piezo-electric bender 10 is in its non-activated state (FIG. 1A), wherein the bender 10 remains substantially parallel to a longitudinal axis 190. When contact 140 is connected to the 60V potential, piezo-electric bender 10 becomes activated and bent with respect to longitudinal axis 190, in the manner shown in FIG. 1B.

If the piezo-electric bender is exposed to water or to another polar fluid, the fluid may be electrolyzed due to potentials applied to the bender electrodes. Accordingly, it is desirable to shield any fluid immediately adjoining the outer surface of the piezo-electric bender from electric fields generated within the bender.

In accordance with a preferred embodiment of the invention, a conductive coating 18 is provided over the entirety of bender 10 to create a Faraday shield. A Faraday shield, as known to persons of ordinary skill in the electrical arts, is a conducting enclosure which, by virtue of its equipotential surface, shields its exterior from the effect of any field sources within the conducting enclosure. Thus, no electric field will be present in the region 20 exterior to conductive coating 18 due to potentials applied within conductive coating 18. Any conductive coating 18, applied using any technique of deposition, is within the scope of the present invention. Conductive coating 18 is preferably non-porous, so that no fluid may enter within the region enclosed by the conductive coating. Alternatively or additionally, conductive coating 18 may, in turn, be coated by another coating, of a non-porous material to prevent entry of fluid into the region enclosed by the conductive coating.

The composition of conductive coating 18 may be a metal alloy, a gel, or any other conductive material. As discussed above, a layer of a fluid barrier, for instance, a hydrophobic composition such as parylene, can be applied about the coating 18 to prevent fluid from entering the region inside of the Faraday shield.

Referring further to FIG. 2, in accordance with another embodiment of the invention, in any configuration of the bender electrodes having a number of piezo-layers divisible by four, the outermost electrodes connected to contact 160 will be exterior electrodes, in the sense that no other electrode lies between the exterior electrode and any surrounding medium. Thus, by grounding contact 160, electrical shielding is achieved with respect to two faces of the bender. Fringing electric fields, however, may still escape from the piezo-bender edges into the fluid region.

Figure 3A:
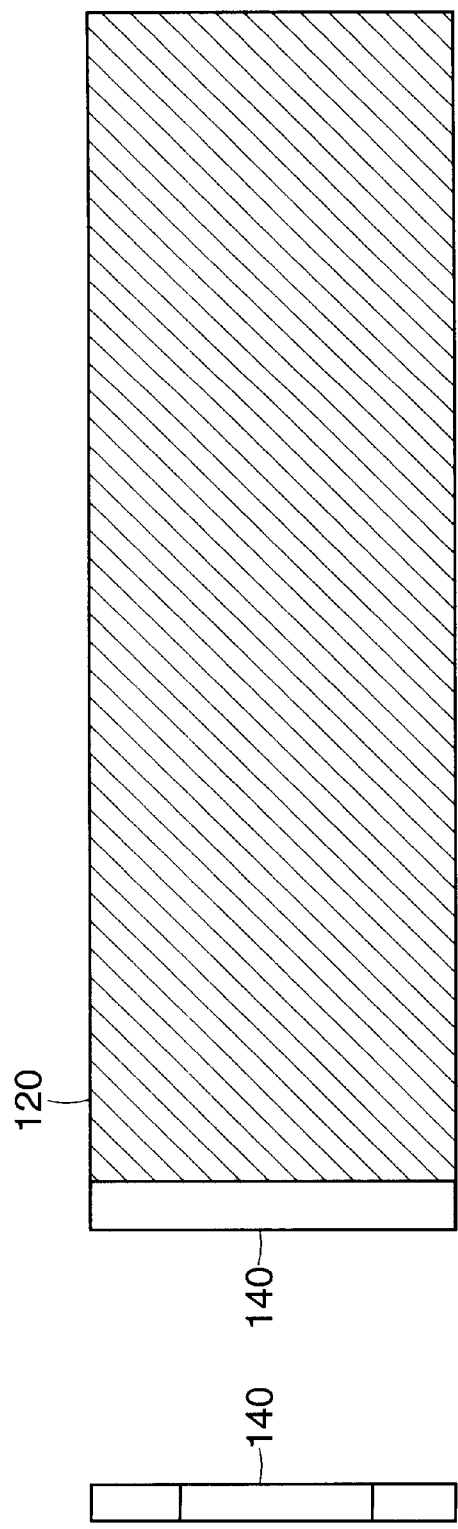
FIGS. 3A–C are top, side, and end views of a piezo-electric bender in accordance with an embodiment of the present invention.
Figure 3B:
Figure 3C:
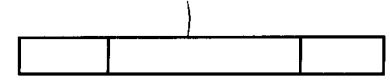

FIG. 3A–C illustrate top, side and end views of piezo-electric bender 10 of FIG. 2. Contacts 120, 140, and 160, connected, respectively, as described above, to the upper group 12, lower group 14 and inner group 16 of electrodes, as shown in FIG. 2, are shown as they appear at the exterior of the bender assembly. In accordance with an alternate embodiment of the invention, contacts 160 and 120, connected to the interior and upper groups of electrodes, respectively, are both grounded. Thus, electrical fields created between electrodes of the actuator are terminated within the device, other than for fringing effects. The surrounding medium is thus effectively shielded from fields created within the actuator.

In accordance with another embodiment of the invention, contacts 120 and 160 may be extended, by any known means of creating a conducting coating, to cover the entire exterior of the piezo-electric actuator. This has the effect of generating a Faraday shield enclosing the entire device, as discussed above. Means are provided, in accordance with an embodiment of the invention, to bring out a lead connected to contact 140, in order to apply a voltage potential with respect to the common ground connection of contacts 120 and 160. Since electric fields generated within the actuator are shielded, in the manner described, from the surrounding medium, electrolysis of the medium may be eliminated, thereby reducing the amount of corrosion to the device.

In order for the conductive coating 18 to act as a Faraday shield, shielding electric fields from penetrating the surrounding fluid, it is important to exclude the fluid from the region interior to the conductive coating. As a result, a substantially non-porous coating may be provided to exclude fluid from the interior of the shield. In one embodiment of the invention the electrically conductive coating 18 may act as the non-porous coating. Alternatively or additionally, a layer of a fluid barrier, for instance, a hydrophobic composition such as parylene, can also be applied about the coating 18 to further prevent water leakage or migration to the interior of the conductive coating.

While the invention has been described in connection with specific embodiments thereof, it will be understood that it is capable of further modification. In particular, each of the contacts may be moved to a location along the bender 10 different from that shown in, for instance FIGS. 3A–C, so as to facilitate coating of the non-porous hydrophobic composition onto the bender. Modifications in the composition of the coating or the number of coatings may also be made. Additionally, use of the piezo-electric element as a sensor is within the scope of the invention and of the appended claims.

What is claimed is:

1. A piezo-electric actuator operable in a fluid, the actuator comprising:
    a piezoelectric element having first and second electrical leads;
    an electrically grounded conductive layer surrounding the piezo-electric element; and
    a seal surrounding the piezo-electric element, the seal being substantially impermeable to the fluid.

2. A piezo-electric actuator according to claim 1, wherein the conductive layer is electrically coupled to one of the first and second electrical leads.

3. A piezo-electric actuator according to claim 1, wherein the conductive layer and the substantially impermeable seal are provided by a single material.

4. A piezo-electric actuator according to claim 1, wherein the conductive layer is enclosed by the substantially impermeable seal.

5. A piezo-electric actuator operable in a fluid, the actuator comprising:
    a piezo-electric element;
    an electrically grounded shield means for providing electrical shielding around the piezo-electric element; and
    sealant means for sealing the piezo-electric element from fluid surrounding the piezo-electric element.

6. A piezo-electric actuator according to claim 5, wherein a single material provides the shield means and sealant means.

7. The piezo-electric actuator according to claim 6, wherein the sealant means seals the shield means from fluid surrounding the shield means.

8. A piezo-electric actuator operable in a fluid, the actuator comprising:
    a piezo-electric element having exterior and interior electrodes, the exterior electrodes being electrically grounded; and
    a seal surrounding the piezo-electric element, the seal being substantially impermeable to the fluid.

9. A method for activating a piezo-electric actuator for operation in a fluid, the piezo-electric actuator having first and second electrodes, the method comprising:
    (a) providing an electrically grounded conductive coating at the exterior of the piezo-electric actuator;
    (b) sealing the electrically conductive coating from the fluid by means of a seal substantially impermeable to the fluid; and (c) applying an electrical potential across the first and second electrodes.

10. A piezo-electric actuator operable in a fluid, the actuator comprising:
   a. a top piezo-electric layer having an outward-facing conducting side;
   b. a bottom piezo-electric layer having an outward-facing conducting side;
   c. a plurality of intermediate piezo-electric layers disposed between the top piezoelectric layer and the bottom piezo-electric layer, each intermediate piezo-electric layer having a piezo-electric side and a conductor side, the top, bottom, and intermediate piezo-electric layers comprising a piezo-electric stack; and
   d. a seal surrounding the piezo-electric stack, the seal being substantially impermeable to the fluid,
   wherein the outward-facing conducting side of the top piezo-electric layer is maintained at a first constant voltage during operation of the actuator and the outward-facing conducting side of the bottom piezo-electric layer is maintained at a second constant voltage during operation of the actuator.

11. A piezo-electric actuator according to claim 10, wherein the first and second constant voltages are equal.

12. A piezo-electric actuator according to claim 10, wherein one of the first and second constant voltages is ground potential.

* * * * *